(12) United States Patent
Huang

(10) Patent No.: US 10,838,271 B2
(45) Date of Patent: Nov. 17, 2020

(54) ARRAY SUBSTRATE AND DISPLAY PANEL USING THE SAME

(71) Applicants: HKC CORPORATION LIMITED, Guangdong (CN); CHONGQING HKC OPTOELECTRONICS TECHNOLOGY CO., LTD., Chongqing (CN)

(72) Inventor: Shishuai Huang, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 306 days.

(21) Appl. No.: 15/745,502

(22) PCT Filed: Dec. 19, 2017

(86) PCT No.: PCT/CN2017/117075
§ 371 (c)(1),
(2) Date: Jan. 17, 2018

(87) PCT Pub. No.: WO2019/090906
PCT Pub. Date: May 16, 2019

(65) Prior Publication Data
US 2020/0081307 A1  Mar. 12, 2020

(30) Foreign Application Priority Data

Nov. 7, 2017  (CN) .......................... 2017 1 1083933

(51) Int. Cl.
G02F 1/1345 (2006.01)
G02F 1/1337 (2006.01)
H01L 27/12 (2006.01)

(52) U.S. Cl.
CPC ........ *G02F 1/13452* (2013.01); *G02F 1/1337* (2013.01); *H01L 27/124* (2013.01)

(58) Field of Classification Search
CPC ... G02F 1/13452; G02F 1/1345; G02F 1/1337
See application file for complete search history.

(56) References Cited

U.S. PATENT DOCUMENTS

2004/0008316 A1  1/2004  Eguchi et al.
2007/0279565 A1*  12/2007  Iwato ................ G02F 1/133711
                                                                349/139
(Continued)

FOREIGN PATENT DOCUMENTS

| CN | 1916743 A | 2/2007 |
| CN | 101089713 A | 12/2007 |

OTHER PUBLICATIONS

International Search Report dated Aug. 1, 2018, in the corresponding PCT application PCT/CN2017/117075, 9 pages in Chinese, 2 pages in English.

*Primary Examiner* — Thanh Nhan P Nguyen
(74) *Attorney, Agent, or Firm* — Juan Carlos A. Marquez; Marquez IP Law Office, PLLC

(57) ABSTRACT

A array substrate comprises a substrate including a displaying area and a plurality of fan out areas surrounding the displaying area, and a plurality of thin film transistors and a plurality of pixel units disposing on the displaying area. A plurality of driving units are disposed on a border of the substrate and are electrically connected to the plurality of signal lines. A plurality of conductive connection lines are separately disposed between the plurality of driving units and are located on the fan out areas, and electrically connected to the plurality of driving units. Wherein a plurality of flow guiding grooves are formed between the plurality of conductive connection lines and have longitudinal direction (Continued)

extending from the inner of the substrate toward to the edge of the substrate, and each of the plurality of flow guiding grooves is in a shape of line.

18 Claims, 7 Drawing Sheets

(56) References Cited

U.S. PATENT DOCUMENTS

| | | | | |
|---|---|---|---|---|
| 2011/0134352 | A1* | 6/2011 | Nakagawa | ............ G02F 1/1339 349/43 |
| 2015/0301370 | A1* | 10/2015 | Moriwaki | ............. G02F 1/1339 349/42 |
| 2017/0192322 | A1 | 7/2017 | Jung et al. | |
| 2019/0074301 | A1* | 3/2019 | Han | ..................... H05K 999/99 |

* cited by examiner

ARRAY SUBSTRATE AND DISPLAY PANEL USING THE SAME

FIELD OF THE INVENTION

The present invention relates to an array substrate and a display panel using the same, and more particularly to an array substrate of a liquid crystal display panel having a retaining structure.

BACKGROUND OF THE INVENTION

In recent years, with the progress of science and technology, the liquid crystal display has the advantages of power saving, no radiation, small size, low power consumption, flat right angle, high resolution, stable image quality and the like, and is especially suitable for various types of information products such as: a Mobile phone, a notebook computer, a digital cameras, a PDA, a liquid crystal display screen and the like are more and more popular, so that the demand of the liquid crystal display (LCD) is greatly increased.

At present, the liquid crystal displays widely used are generally provided with two substrates and a liquid crystal layer is interposed between the two substrates, and a sealing member is positioned between the two substrates in the peripheral region so as to bond the two substrates together, and the liquid crystal layer is hermetically sealed between the two substrates. Furthermore, in order to enable liquid crystal molecules between two substrates to form a certain pre-tilt orientation, an alignment layer or an orientation layer needs to be formed on the surfaces of the two substrates respectively. After the formation of the alignment layer with the pre-tilt orientation groove is completed, the sealing member is used to bond the two substrates together.

The present techniques used to perform the alignment layer roughly are printing and coating two ways. In general, the procedure of the printing technique is more complicated comparing with the coating technique and mainly using for manufacturing small size display panel, and the coating technique is profitable in manufacturing large size display panel by reason of coating efficiency. In the manufacturing process of the liquid crystal display panel, generally by disposing retaining walls such as a plurality of dummy photospacer walls and a plurality of grooves to preclude the non-display area of the color filter substrate from the liquid solution of the alignment layer (i.e., polyimide), thereby the liquid solution of the alignment layer can be flow back to the effective displaying area of the display panel.

However, in the surface of the opposing substrate, that is, thin film transistor substrate, it can't be design with the retaining walls to prevent the liquid solution of the alignment layer flow into the non-display area especially at the junction of the peripheral wiring region and fan out area. Due to the design requirement of the fan out area, an adequate peripheral wiring region for the fan out area needs to be reserved previously so as to arrange all of the transmitting signal lines. Generally, the fan out area is in a shape of triangle, the broadness side near to the border of the liquid crystal display panel, the transmitting signal lines are gradually crowded in the acute portion close to the displaying area, and therefore the liquid solution of the alignment layer is easy accumulated at the area near the acute portion.

At present, the coating precision of the liquid solution of the alignment layer is controlled by adjusting a coating machine on the side of an array substrate, and most of the coating methods are spray coating methods. However, the size of the fan out area determines the size of a frame of the substrate of the liquid crystal display panel, and the size of the fan out area is determined by the number of the signal lines, that is, the resolution of the display panel determines the size of the frame. Facing the requirements of high resolution and large size display panel, the spray coating machine is not easy in controlling the coating accuracy especially to meet the narrow frame product requirements.

SUMMARY OF THE INVENTION

In order to solve the aforementioned technical problem, it is an object of the present invention to provide an array substrate and a display panel, and a fan out structure employing thereof is possible to prevent the deposited liquid solution of the alignment layer from accumulating on the conductive connection lines near the acute portion of the fan out area close to the displaying area or flowing back to the effective display area without significantly changing the prerequisite of the existing production process.

The purpose of the present invention and the aforementioned technical problem to be solved can be realized by the following technical embodiments. According to the present invention, it provides an array substrate, the array substrate comprises a substrate including a displaying area and a fan out area, a plurality of signal lines, a plurality of thin film transistors and a plurality of pixel units disposing on the displaying area. Wherein the plurality of pixel units are electrically connected to the plurality of thin film transistors respectively, the plurality of thin film transistors are electrically connected to the plurality of signal lines respectively. And the plurality of signal lines further include a plurality of gate lines and a plurality of source lines. A plurality of driving units are disposed a the border of the substrate and are electrically connected to the plurality of signal lines. A plurality of conductive connection lines are separately disposed between the plurality of driving units and are located on the fan out area, and electrically connected to the plurality of driving units. Wherein a plurality of flow guiding grooves are formed between the plurality of conductive connection lines and have longitudinal direction extending from the inner of the substrate toward to the edge of the substrate, and each of the plurality of flow guiding grooves is in a shape of line.

The purpose of the present invention and the aforementioned technical problem to be solved can be further realized by the following technical embodiments.

In one embodiment of the present invention, the shape of line of the plurality of flow guiding grooves is a straight line, a curve, a bending line or any combination of the straight line, the curve and the bending line.

In one embodiment of the present invention, the plurality of conductive connection lines further comprise a boundary line close to the edge of the substrate, a distance between the two adjacent conductive connection lines is substantially the same, different or partially the same.

In one embodiment of the present invention, the plurality of flow guiding grooves are arranged in parallel and connecting to the boundary line.

In one embodiment of the present invention, the plurality of conductive connection lines further comprise at least one split line, a plurality of groove regions are divided by the split line, the plurality of flow guiding grooves of each of the plurality of groove regions are arranged in parallel and a longitudinal direction of each of the plurality of groove regions is the same or different.

In one embodiment of the present invention, the two adjacent groove regions having the plurality of flow guiding grooves are arranged in symmetric.

In one embodiment of the present invention, the plurality of groove regions are two groove regions, three groove regions or four groove regions.

In one embodiment of the present invention, the plurality of flow guiding grooves of each of the plurality of groove regions are arranged in parallel, and the longitudinal direction of each of the plurality of groove regions is different and toward to a specific point respectively.

In one embodiment of the present invention, the array substrate further comprises an array structure formed on the displaying area, a first alignment layer formed on the array structure and extending to the fan out area.

In one embodiment of the present invention, a width of each of the plurality of flow guiding grooves is substantially the same, different or partially the same.

Another object of the present invention is to provide an array substrate comprising a substrate including a displaying area and a fan out area, a plurality of signal lines, a plurality of thin film transistors and a plurality of pixel units disposing on the displaying area. Wherein the plurality of pixel units are electrically connected to the plurality of thin film transistors respectively, the plurality of thin film transistors are electrically connected to the plurality of signal lines respectively. And the plurality of signal lines further includes a plurality of gate lines and a plurality of source lines. A plurality of driving units are disposed on the border of the substrate and electrically connected to the plurality of signal lines, and a plurality of conductive connection lines are separately disposed between the plurality of driving units and locating on the fan out area and electrically connected to the plurality of driving units. Wherein a plurality of flow guiding grooves are formed between the plurality of conductive connection lines and have longitudinal direction extending from the inner of the substrate toward to the edge of the substrate. Each of the plurality of flow guiding grooves is in a shape of line, and an inlet opening of each fan out area is disposed at the confluence of each end of the plurality of conductive connection lines closest to the inner of the substrate. Moreover, the inlet opening is connected with the plurality of flow guiding grooves.

Another object of the present invention is to provide a liquid crystal display panel comprising an array substrate and an opposing substrate disposing opposite to the array substrate. Wherein the array substrate is selected from one of the aforementioned embodiments.

Under the consideration without significantly changing the prerequisite of the existing production process, a fan out structure, an array substrate and a display pan& employing thereof of the present invention is possible to prevent the deposited liquid solution of the alignment layer from accumulating on the conductive connection lines near the acute portion of the fan out area close to the displaying area or flowing back to the effective display area. Moreover, the distances between the adjacent flow guiding grooves can be designed by the size of the droplets of the liquid solution of the alignment layer accordingly, and thereby maximize the fluidity of the liquid solution of the alignment layer and do not affect the photo-curing of the sealant while jointing the two substrates together. Furthermore, the technology provided by the invention can be used for manufacturing various types of liquid crystal display panel, and is high in applicability.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures.

DETAILED DESCRIPTION OF THE EMBODIMENTS

Figure 1A:
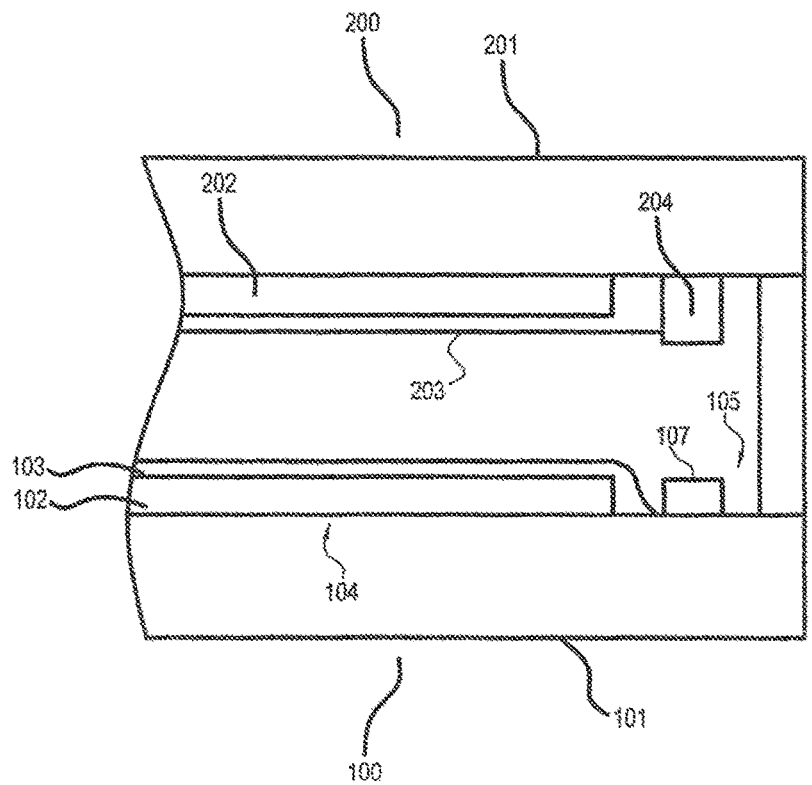
FIG. 1a is a schematic cross-sectional view of an exemplary liquid crystal display panel according to one embodiment of the present invention.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

Furthermore, in the specification, "on" implies being positioned above or below a target element and does not imply being necessarily positioned on the top on the basis of a gravity direction.

For further explaining the technical means and efficacy of the present application intended to file, an array substrate and a display panel including the embodiments, structures, features and effects thereof according to the present invention will be apparent from the following detailed description and accompanying drawings.

The display panel of the present invention may be, for example, OLED display panel, QLED display panel or the other display panel. Take a liquid crystal display panel for an instance, the liquid crystal display panel comprises a first substrate and a second substrate and a liquid crystal layer disposing between those two substrates and sealing by the glue like photo-curing sealant. The first substrate and the second substrate can be a thin film transistor substrate and a color filter substrate, but not limited thereto. In some embodiments, the thin film transistor and the color filter of the present invention can be formed on the same substrate.

In some embodiments, the display panel of the present invention may be a curved display panel.

Figure 1B:
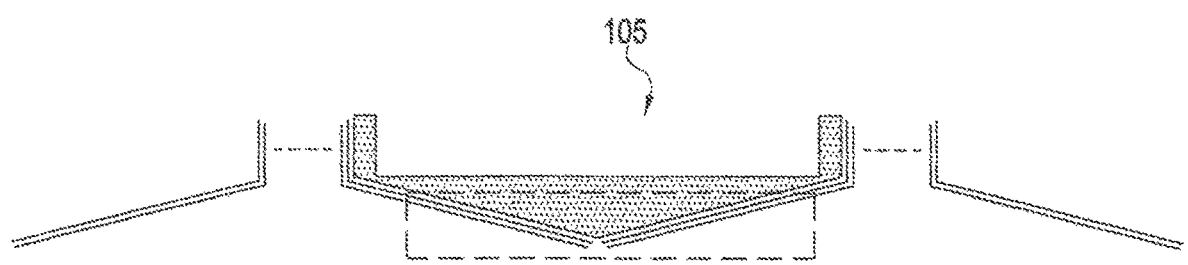
FIG. 1b is a schematic view of enlarge portion of a fan out area according to one embodiment of the present invention.
Figure 1C:
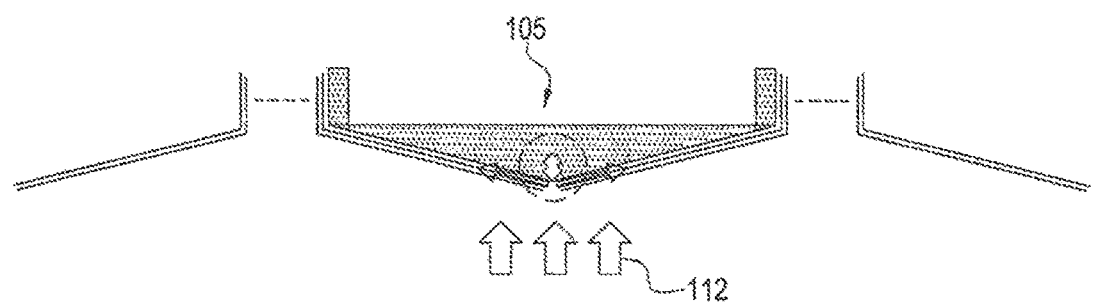
FIG. 1c is a schematic view showing the accumulation of the liquid solution of the alignment layer according to one embodiment of the present invention.
Figure 1D:
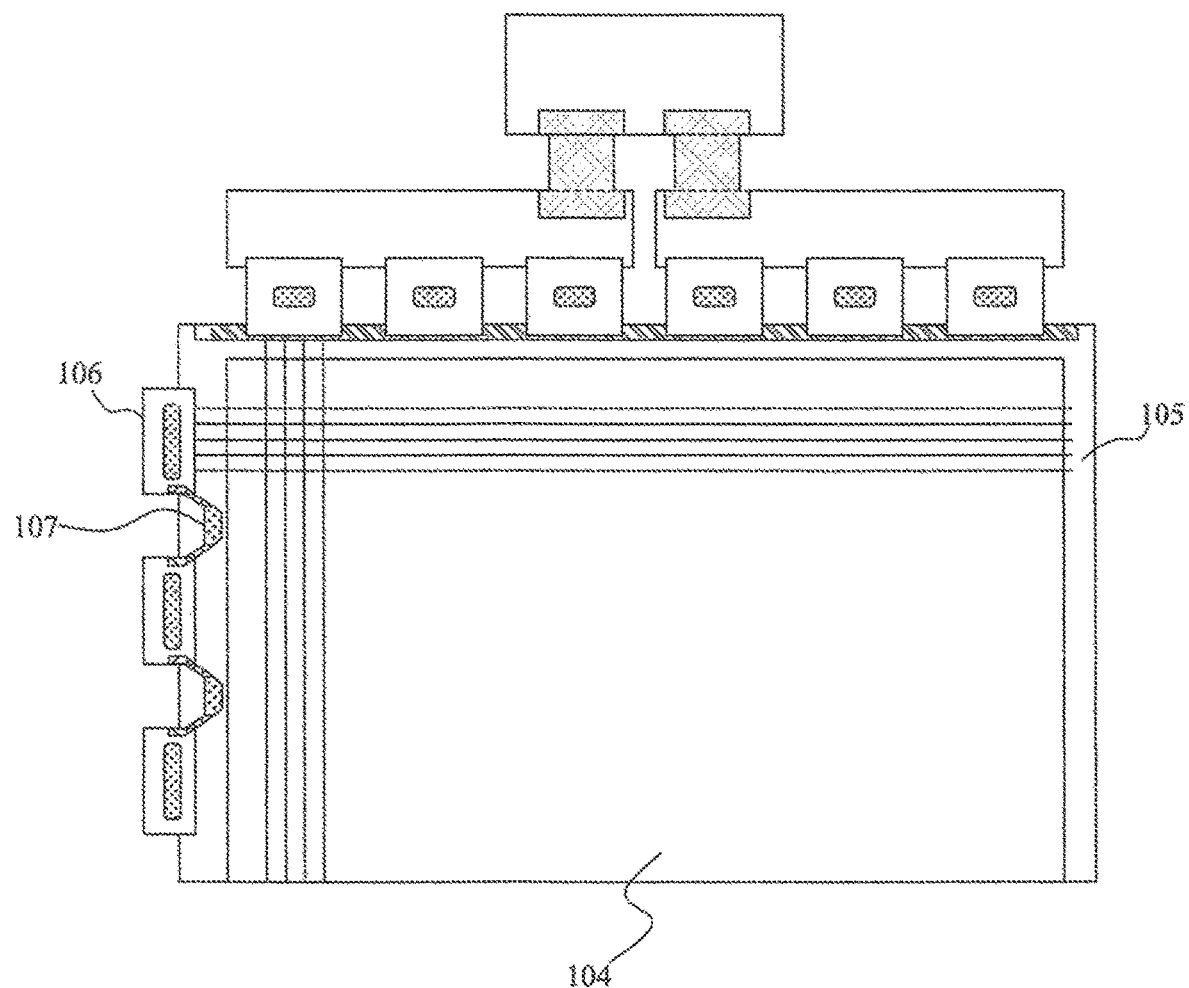
FIG. 1d is a schematic top view of an exemplary liquid crystal display panel according to one embodiment of the present invention.

FIG. 1a is a schematic cross-sectional view of an exemplary liquid crystal display panel according to one embodiment of the present invention. FIG. 1b is a schematic view of enlarge portion of a fan out area according to one embodiment of the present invention. FIG. 1c is a schematic view showing the accumulation of the liquid solution of the alignment layer according to one embodiment of the present invention. FIG. 1d is a schematic top view of an exemplary liquid crystal display panel according to one embodiment of the present invention.

An array substrate 100 employing in a display panel of the present invention comprises a first substrate 101, an array structure 102 formed on the first substrate 101 and including a plurality of signal lines, a plurality of thin film transistors, a plurality of pixel units disposed on the displaying area of the first substrate 101.

The plurality of pixel units are electrically connected to the plurality of thin film transistors respectively, the plurality of thin film transistors are electrically connected to the plurality of signal lines respectively, and the plurality of signal lines further includes a plurality of gate lines and a plurality of source lines. A first alignment layer 103 is formed on the array structure 102. A color filter substrate 200 includes a second substrate 201, a color filter layer 202 formed on the second substrate 201, and a second alignment layer 203 formed on the color filter layer 202. A plurality of driving units 106 are disposed on the fan out area 105 of the first substrate 105 and electrically connected to the plurality of signal lines. A plurality of conductive connection lines 107 are separately disposed between the plurality of driving units and locating on the fan out area, and electrically connected to the plurality of driving units.

In some embodiments, the retaining wall structure 204 is formed on the second substrate 201 and substantially surrounding the second alignment layer 203. Generally, the retaining wall structure 204 includes a plurality of different structures such as a groove, a dummy photo spaced walls forming by photo spacers, or a non-display area colored resist blocking wall. The retaining wall structure 204 can be designed by at least one or a combination of one or some of the groove, the dummy photo spaced walls forming by photo spacers, and the non-display area colored resist blocking wall according to fabricating process requirements or product requirements.

The materials for the non-display area colored resist blocking wall may be composed of red colored resist material, green colored resist material and blue colored resist material. The dummy photo spaced walls or the non-display area colored resist blocking wall can be formed simultaneous with the photolithography processes of forming the red colored resist material, the blue colored resist material or the green colored resist material of the color filter layer, depending on the process requirements and the mask design.

According to design requirements, a plurality of layers of the dummy photo spaced walls can be formed on the non-display area colored resist blocking wall. The height of the dummy photo spaced walls and the width of the groove are designed to take into account the part of the over spouting of the liquid solution of the alignment layer due to the tolerance and the accuracy of the machine.

Because of the retaining wall structure 204 is formed on the peripheral area of the color filter substrate 200, therefore the liquid solution of the alignment layer (i.e., polyimide, PI) is prevented from being flowed to the non-displaying and might be flow back to the effective displaying area of the display panel.

However, in the surface of the thin film transistor substrate, it can't be designed with the retaining walls to prevent the liquid solution of the alignment layer flow into the non-display area especially at the junction of the peripheral wiring region and fan out area. Referring to FIG. 1b and FIG. 1c, due to the design requirement of the fan out area 105, generally, the fan out area is in a shape of triangle and the broadness side near to the border of the liquid crystal display panel as shown in FIG. 1b with the dotted squire, hence, a plurality of conductive connection lines 107 are gradually crowded in the acute portion close to the displaying area. Consequently, the liquid solution of the alignment layer 112 is easy flowed back to the effective displaying area and therefore accumulated at the area near the acute portion as shown in FIG. 1c with the dotted circle. The aforementioned embodiment is one of the structures of the liquid crystal display panel used as an example, however, the application scope of the present application is not limited thereto, and it can be applied to various types of liquid crystal display panels.

Figure 2:
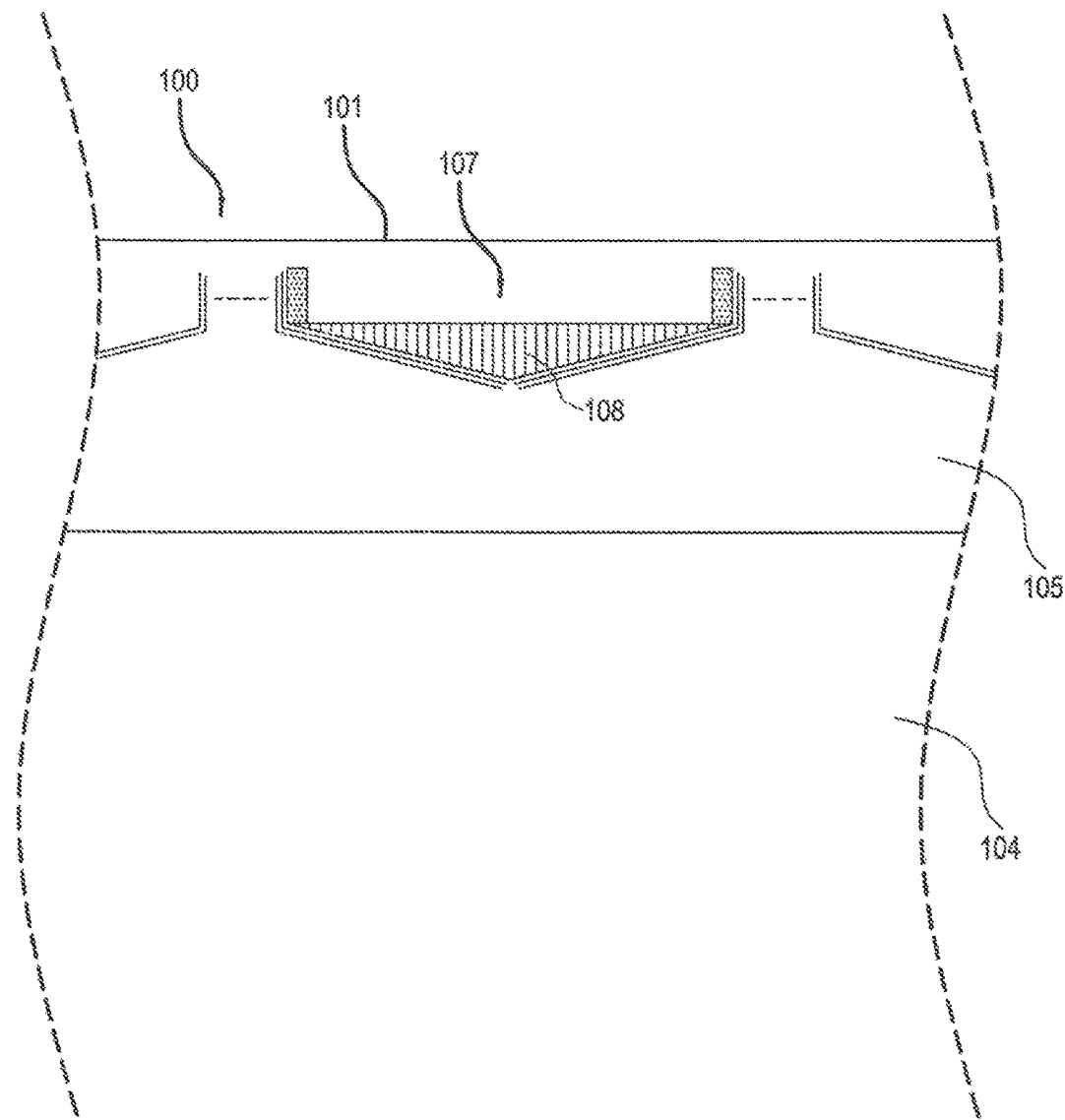
FIG. 2 is a schematic view of enlarge portion of a fan out area according to one embodiment of the present invention.

FIG. 2 is a schematic view of enlarge portion of a fan out area according to one embodiment of the present invention, also referring to FIG. 1a and FIG. 1b for further explaining. As shown in FIG. 2, one embodiment of the present invention provides an array substrate 100 comprising a first substrate 101 including a displaying area 104 and a plurality of fan out areas 105 surrounding the displaying area 104. A plurality of signal lines, a plurality of thin film transistors and a plurality of pixel units are disposed on the displaying area 104 of the first substrate 101 The plurality of pixel units are electrically connected to the plurality of thin film transistors respectively, the plurality of thin film transistors are electrically connected to the plurality of signal lines respectively. And the plurality of signal lines further includes a plurality of gate lines and a plurality of source lines. A plurality of driving units 106 are disposed on the border of the first substrate 101 and electrically connected to the plurality of signal lines, and a plurality of conductive connection lines 107 are separately disposed between the plurality of driving units 106 and locating on the fan out area 105 and electrically connected to the plurality of driving units 106. Wherein a plurality of flow guiding grooves 108 are formed between the plurality of conductive connection lines 107 and have longitudinal direction extending from the inner of the first substrate toward to the edge of the substrate. Each of the plurality of flow guiding grooves 108 is in a shape of line.

In one embodiment of the present invention, the array structure 102 is formed on the displaying area 104, a first alignment layer 103 is formed on the array structure 102 and extending to the fan out area 105.

In one embodiment of the present invention, the shape of line of the plurality of flow guiding grooves 108 is a straight line, a curve, a bending line or any combination of the straight line, the curve and the bending line.

In one embodiment of the present invention, the plurality of conductive connection lines 107 further comprise a boundary line 109a close to the edge of the first substrate 101, a distance between the two adjacent conductive connection lines is substantially the same, different or partially the same.

In one embodiment of the present invention, the plurality of flow guiding grooves are arranged in parallel and connecting to the boundary line.

Figure 3:
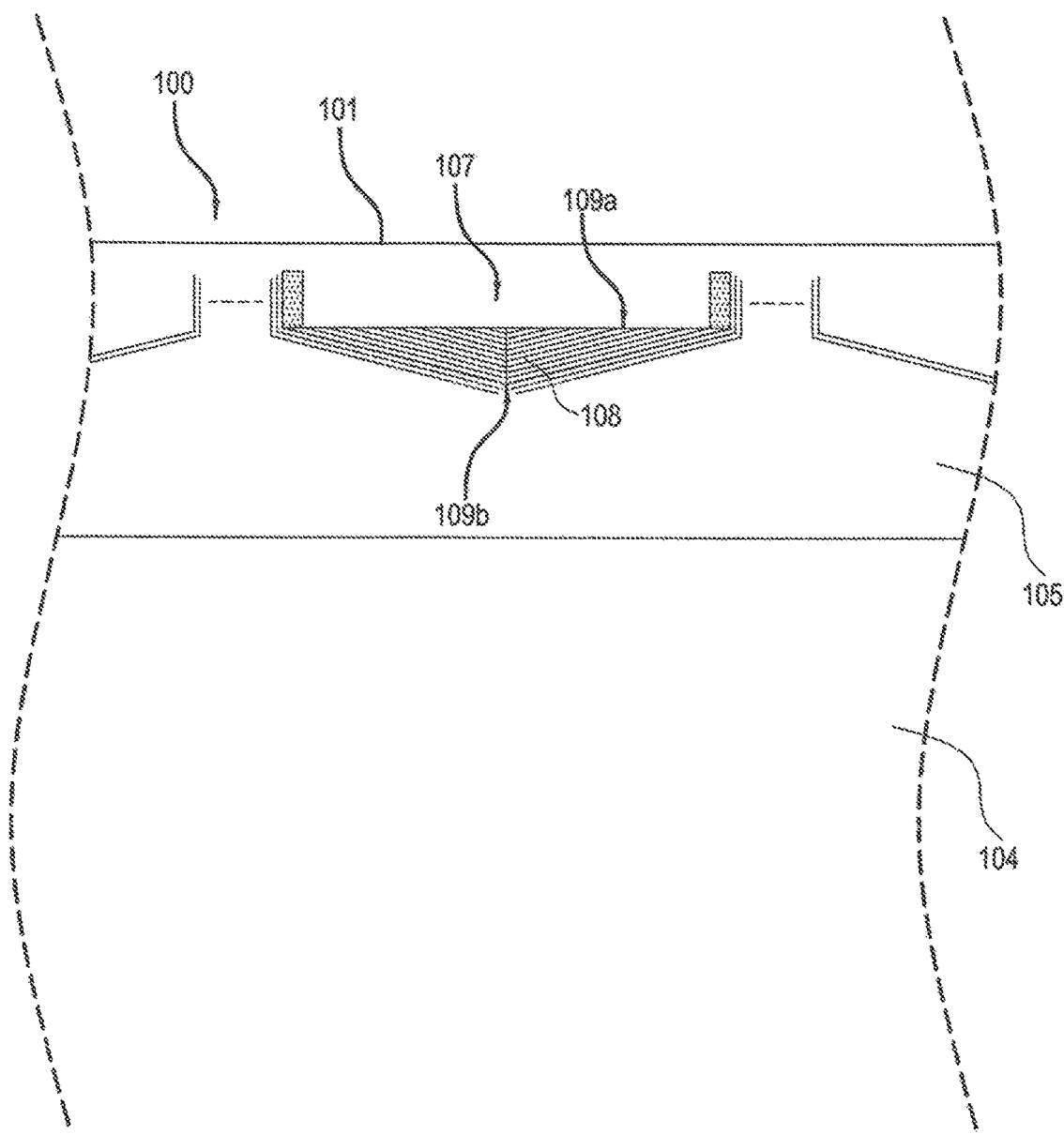
FIG. 3 is a schematic view of enlarge portion of a fan out area according to one embodiment of the present invention.

FIG. 3 is a schematic view of enlarge portion of a fan out area according to one embodiment of the present invention. In some embodiments, a plurality of conductive connection lines 107 are further comprise at least one split line 109b, a plurality of groove regions are divided by the split line 109b, the plurality of flow guiding grooves 108 of each of the plurality of groove regions are arranged in parallel and a longitudinal direction of each of the plurality of groove regions is the same or different.

In one embodiment of the present invention, the plurality of groove regions are two groove regions, three groove regions or four groove regions.

In one embodiment of the present invention, the two adjacent groove regions having the plurality of flow guiding grooves 108 are arranged in symmetric.

Figure 4:
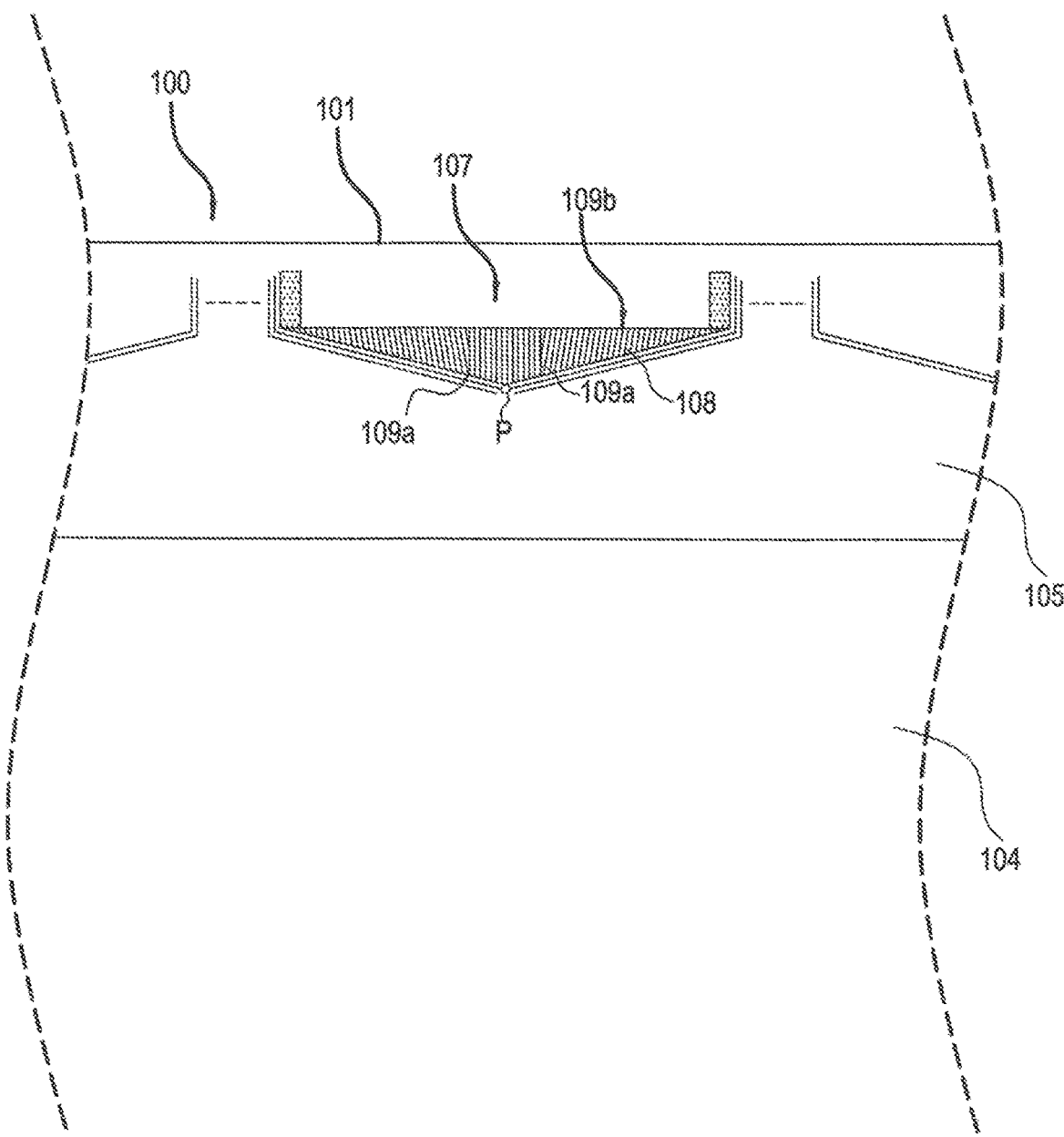
FIG. 4 is a schematic view of enlarge portion of a fan out area according to one embodiment of the present invention.

FIG. 4 is a schematic view of enlarge portion of a fan out area according to one embodiment of the present invention. In some embodiments, the plurality of flow guiding grooves of each of the plurality of groove regions are arranged in parallel, and the longitudinal direction of each of the plurality of groove regions is different and toward to a specific point P respectively.

In one embodiment of the present invention, a width of each of the plurality of flow guiding grooves 108 is substantially the same, different or partially the same.

In some embodiments, the present invention provides an array substrate 100 comprising a first substrate 101 including a displaying area 104 and a plurality of fan out areas 105 surrounding the displaying area 104. A plurality of signal lines, a plurality of thin film transistors and a plurality of pixel units are disposed on the displaying area 104 of the first substrate 101. The plurality of pixel units are electrically connected to the plurality of thin film transistors respectively, the plurality of thin film transistors are electrically connected to the plurality of signal lines respectively. And the plurality of signal lines further includes a plurality of gate lines and a plurality of source lines. A plurality of driving units 106 are disposed on the border of the first substrate 101 and electrically connected to the plurality of signal lines, and a plurality of conductive connection lines 107 are separately disposed between the plurality of driving units 106 and locating on the fan out area 105 and electrically connected to the plurality of driving units 106. Wherein a plurality of flow guiding grooves 108 are formed between the plurality of conductive connection lines 107 and have longitudinal direction extending from the inner of the first substrate toward to the edge of the substrate. Each of the plurality of flow guiding grooves 108 is in a shape of line, and an inlet opening 111 of each fan out area is disposed at the confluence of each end of the plurality of conductive connection lines 107 closest to the inner of the substrate. Moreover, the inlet opening 111 is connected with the plurality of flow guiding grooves 108.

In one embodiment of the present invention, a width of the inlet opening of each fan out area is substantially the same, different or partially the same.

Figure 5:
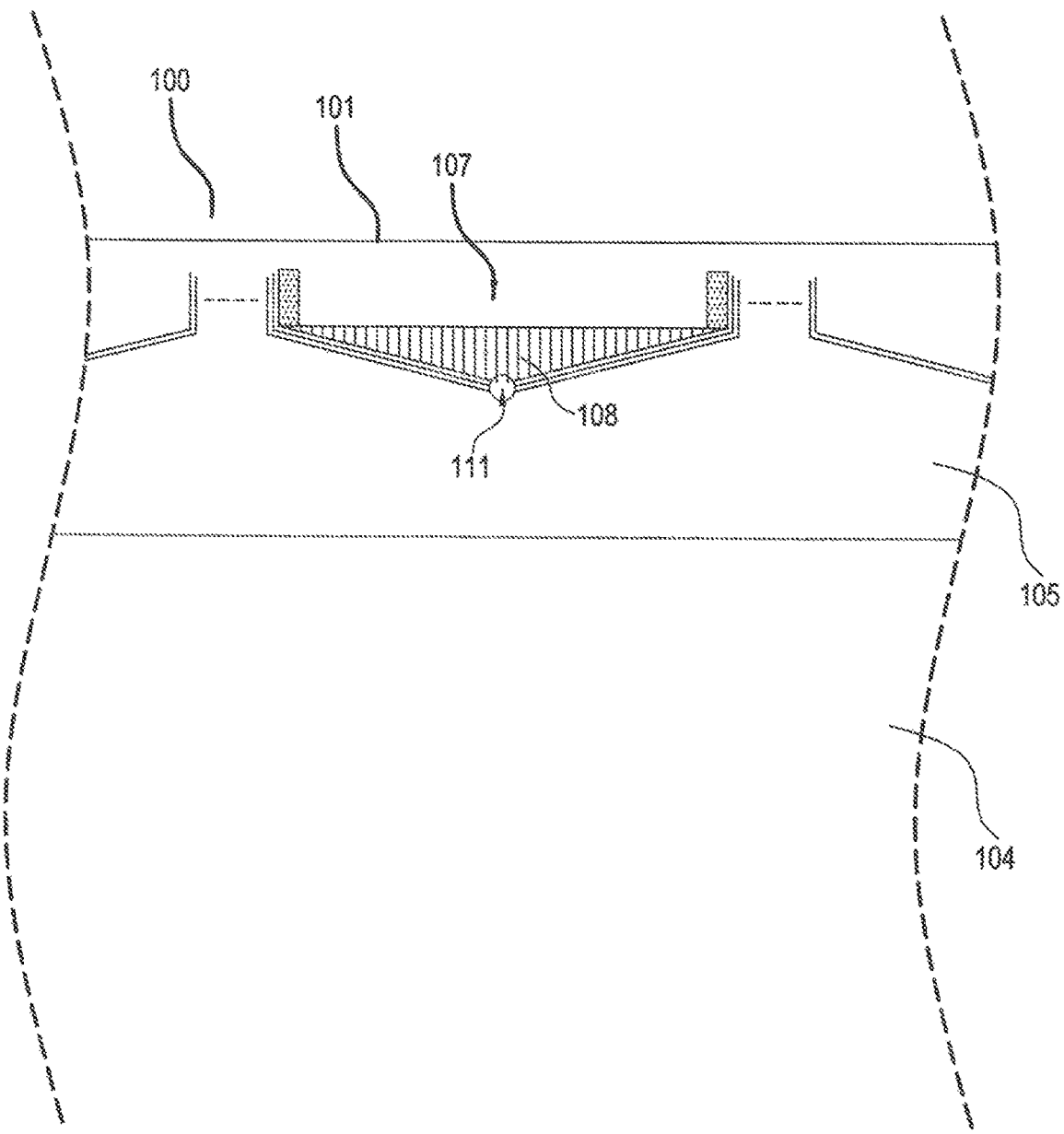
FIG. 5 is a schematic view of enlarge portion of a fan out area according to one embodiment of the present invention.

FIG. 5 is a schematic view of enlarge portion of a fan out area according to one embodiment of the present invention, also referring to FIG. 1a for further explaining. One embodiment of the present invention provides a display panel comprising an array substrate 100 and a color filter substrate 200 disposing opposite to the array substrate. Wherein the array substrate 100 is made by one of the aforementioned embodiments.

In one embodiment of the present invention, the present invention provides a display panel comprising an array substrate and an opposing substrate disposing opposite to the array substrate. Wherein the array substrate 100 is selected from one of the aforementioned embodiments.

The examples and the drawings illustrated in this application are described in terms of the fan out area of the wiring region and its adjacent conductive connection lines, but not limited thereto, and include any form of conductive connection lines disposed between the driving units.

Under the consideration without significantly changing the prerequisite of the existing production process, a fan out structure, an array substrate and a display panel employing thereof of the present invention is possible to prevent the deposited liquid solution of the alignment layer from accumulating on the conductive connection lines near the acute portion of the fan out area close to the displaying area or flowing back to the effective display area. Moreover, the distances between the adjacent flow guiding grooves can be designed by the size of the droplets of the liquid solution of the alignment layer accordingly, and thereby maximize the fluidity of the liquid solution of the alignment layer and do not affect the photo-curing of the sealant while jointing the two substrates together. Furthermore, the technology provided by the invention can be used for manufacturing various types of liquid crystal display panel, and is high in applicability.

In addition, in the specification, unless explicitly described to the contrary, the word "comprise" and variations such as "comprises" or "comprising" will be understood to imply the inclusion of stated elements but not the exclusion of any other elements.

The present invention has been described with a preferred embodiment thereof and it is understood that many changes and modifications to the described embodiment can be carried out without departing from the scope and the spirit of the invention that is intended to be limited only by the appended claims.

What is claimed is:

1. An array substrate of a liquid crystal display panel, comprising:
    a substrate, comprising a displaying area and a fan out area, a plurality of signal lines, a plurality of thin film transistors and a plurality of pixel units disposed on the displaying area, wherein the plurality of pixel units are electrically connected to the plurality of thin film transistors respectively, the plurality of thin film transistors are electrically connected to the plurality of signal lines respectively, and the plurality of signal lines further includes a plurality of gate lines and a plurality of source lines;
    a plurality of driving units, disposed on a border of the substrate and electrically connected to the plurality of signal lines; and
    a plurality of conductive connection lines, separately disposed between the plurality of driving units and located on the fan out area, and electrically connected to the plurality of driving units;

wherein, a plurality of flow guiding grooves are formed between the plurality of conductive connection lines and have a longitudinal direction extending from an inner portion of the substrate toward to an edge of the substrate, and each of the plurality of flow guiding grooves is in a shape of a line; and wherein the line shape of each of the plurality of flow guiding grooves is one of a curve, a bending line and a combination of the curve and the bending line.

2. The array substrate of a liquid crystal display panel according to the claim 1, wherein the plurality of conductive connection lines further comprise a boundary line close to the edge of the substrate, a distance between the two adjacent conductive connection lines is substantially the same, different or partially the same.

3. The array substrate of a liquid crystal display panel according to the claim 2, wherein the plurality of flow guiding grooves are arranged in parallel and connecting to the boundary line.

4. The array substrate of a liquid crystal display panel according to the claim 1, wherein the plurality of conductive connection lines further comprise at least a split line, a plurality of groove regions are divided by the split line, and the plurality of flow guiding grooves of each of the plurality of groove regions are arranged in parallel and a longitudinal direction of each of the plurality of groove regions is the same or different.

5. The array substrate of a liquid crystal display panel according to the claim 4, wherein the two adjacent groove regions having the plurality of flow guiding grooves are arranged in symmetric.

6. The array substrate of a liquid crystal display panel according to the claim 4, wherein the plurality of groove regions are two groove regions, three groove regions or four groove regions.

7. The array substrate of a liquid crystal display panel according to the claim 4, wherein the plurality of flow guiding grooves of each of the plurality of groove regions are arranged in parallel, and the longitudinal direction of each of the plurality of groove regions is different and toward to a specific point respectively.

8. The array substrate of a liquid crystal display panel according to the claim 1, further comprising an array structure formed on the displaying area, and a first alignment layer formed on the array structure and extending to the fan out area.

9. The array substrate of a liquid crystal display panel according to the claim 1, wherein a width of each of the plurality of flow guiding grooves is substantially the same, different or partially the same.

10. An array substrate of a liquid crystal display panel, comprising:
a substrate, comprising a displaying area and a fan out area, a plurality of signal lines, a plurality of thin film transistors and a plurality of pixel units disposed on the displaying area, wherein the plurality of pixel units are electrically connected to the plurality of thin film transistors respectively, the plurality of thin film transistors are electrically connected to the plurality of signal lines respectively, and the plurality of signal lines further includes a plurality of gate lines and a plurality of source lines;
a plurality of driving units, disposed on a border of the substrate and electrically connected to the plurality of signal lines; and
a plurality of conductive connection lines, separately disposed between the plurality of driving units and located on the fan out area, and electrically connected to the plurality of driving units;

wherein, a plurality of flow guiding grooves are formed between the plurality of conductive connection lines and have longitudinal direction extending from the inner of the substrate toward to the edge of the substrate, and each of the plurality of flow guiding grooves is in a shape of a line, an inlet opening of each fan out area is disposed at a confluence of each end of the plurality of conductive connection lines closest to an inner portion of the substrate, and the inlet opening is connected with the plurality of flow guiding grooves; and wherein the line shape of each of the plurality of flow guiding grooves is one of a curve, a bending line and a combination of the curve and the bending line.

11. A liquid crystal display panel, comprising:
an array substrate; and
an opposing substrate, disposed opposite to the array substrate;
wherein the array substrate comprises:
a substrate, including a displaying area and a fan out area, a plurality of signal lines, a plurality of thin film transistors and a plurality of pixel units disposed on the displaying area, wherein the plurality of pixel units are electrically connected to the plurality of thin film transistors respectively, the plurality of thin film transistors are electrically connected to the plurality of signal lines respectively, and the plurality of signal lines further include a plurality of gate lines and a plurality of source lines;
a plurality of driving units, disposed on a border of the substrate and electrically connected to the plurality of signal lines; and
a plurality of conductive connection lines, separately disposed between the plurality of driving units and located on the fan out area, and electrically connected to the plurality of driving units;
wherein, a plurality of flow guiding grooves are formed between the plurality of conductive connection lines and have a longitudinal direction extending from an inner portion of the substrate toward to an edge of the substrate, and each of the plurality of flow guiding grooves is in a shape of a line; and
wherein the line shape of each of the plurality of flow guiding grooves is one of a curve, a bending line and a combination of the curve and the bending line.

12. The liquid crystal display panel according to claim 11, wherein the plurality of conductive connection lines further comprise a boundary line close to the edge of the substrate, a distance between the two adjacent conductive connection lines is substantially the same, different or partially the same.

13. The liquid crystal display panel according to claim 12, wherein the plurality of flow guiding grooves are arranged in parallel and connecting to the boundary line.

14. The liquid crystal display panel according to claim 11, wherein the plurality of conductive connection lines further comprise at least one split line, a plurality of groove regions are divided by the split line, the plurality of flow guiding grooves of each of the plurality of groove regions are arranged in parallel and a longitudinal direction of each of the plurality of groove regions is the same or different.

15. The liquid crystal display panel according to claim 14, wherein the two adjacent groove regions having the plurality of flow guiding grooves are arranged in symmetric.

16. The liquid crystal display panel according to claim 14, wherein the plurality of groove regions are two groove regions, three groove regions or four groove regions.

17. The liquid crystal display panel according to claim 14, wherein the plurality of flow guiding grooves of each of the plurality of groove regions are arranged in parallel, and the longitudinal direction of each of the plurality of groove regions is different and toward to a specific point respectively.

18. The liquid crystal display panel according to claim 11, further comprising an array structure formed on the displaying area, and a first alignment layer formed on the array structure and extending to the fan out area.

\* \* \* \* \*